US008452028B2

(12) United States Patent
Dahl et al.

(10) Patent No.: US 8,452,028 B2
(45) Date of Patent: May 28, 2013

(54) DYNAMIC SURROUND CHANNEL VOLUME CONTROL

(75) Inventors: John Dahl, San Rafael, CA (US); Casey Divine, Edinburgh (GB)

(73) Assignee: THX, Ltd., San Rafael, CA (US)

( * ) Notice: Subject to any disclaimer, the term of this patent is extended or adjusted under 35 U.S.C. 154(b) by 1305 days.

(21) Appl. No.: 11/955,243

(22) Filed: Dec. 12, 2007

(65) Prior Publication Data

US 2008/0159546 A1 Jul. 3, 2008

Related U.S. Application Data

(60) Provisional application No. 60/874,686, filed on Dec. 12, 2006.

(51) Int. Cl.
*H03G 3/00* (2006.01)

(52) U.S. Cl.
USPC ............... 381/104; 381/109; 381/2; 381/307; 381/28; 381/120; 381/57; 381/107

(58) Field of Classification Search
USPC ............. 381/307, 104, 107, 57, 120, 28, 109, 381/2
See application file for complete search history.

(56) References Cited

U.S. PATENT DOCUMENTS

| | | | | | |
|---|---|---|---|---|---|
| 4,204,092 | A * | 5/1980 | Bruney | ........................... | 381/18 |
| 5,798,818 | A * | 8/1998 | Derderian et al. | .............. | 352/31 |
| 5,907,622 | A | 5/1999 | Dougherty | | |
| 6,263,354 | B1 | 7/2001 | Gandhi | | |
| 2004/0071294 | A1 | 4/2004 | Halagas, Jr. et al. | | |
| 2006/0088175 | A1 | 4/2006 | Eid et al. | | |
| 2006/0274900 | A1 | 12/2006 | Griesinger | | |

FOREIGN PATENT DOCUMENTS

| | | |
|---|---|---|
| WO | 9926337 | 5/1999 |
| WO | WO2006047600 | 5/2006 |

* cited by examiner

*Primary Examiner* — Kimberly Rizkallah
*Assistant Examiner* — Timor Karimy
(74) *Attorney, Agent, or Firm* — K. David Crockett, Esq.; Paul J. Backofen, Esq.; Crockett & Crockett, PC

(57) ABSTRACT

A dynamic surround channel volume control applies a variable gain control to the surround channels of a multi-channel system. Thus the levels of the surround channels are related to the main volume control of the system. This maintains a predictable relationship between the surround channels and the main or front channels.

3 Claims, 1 Drawing Sheet

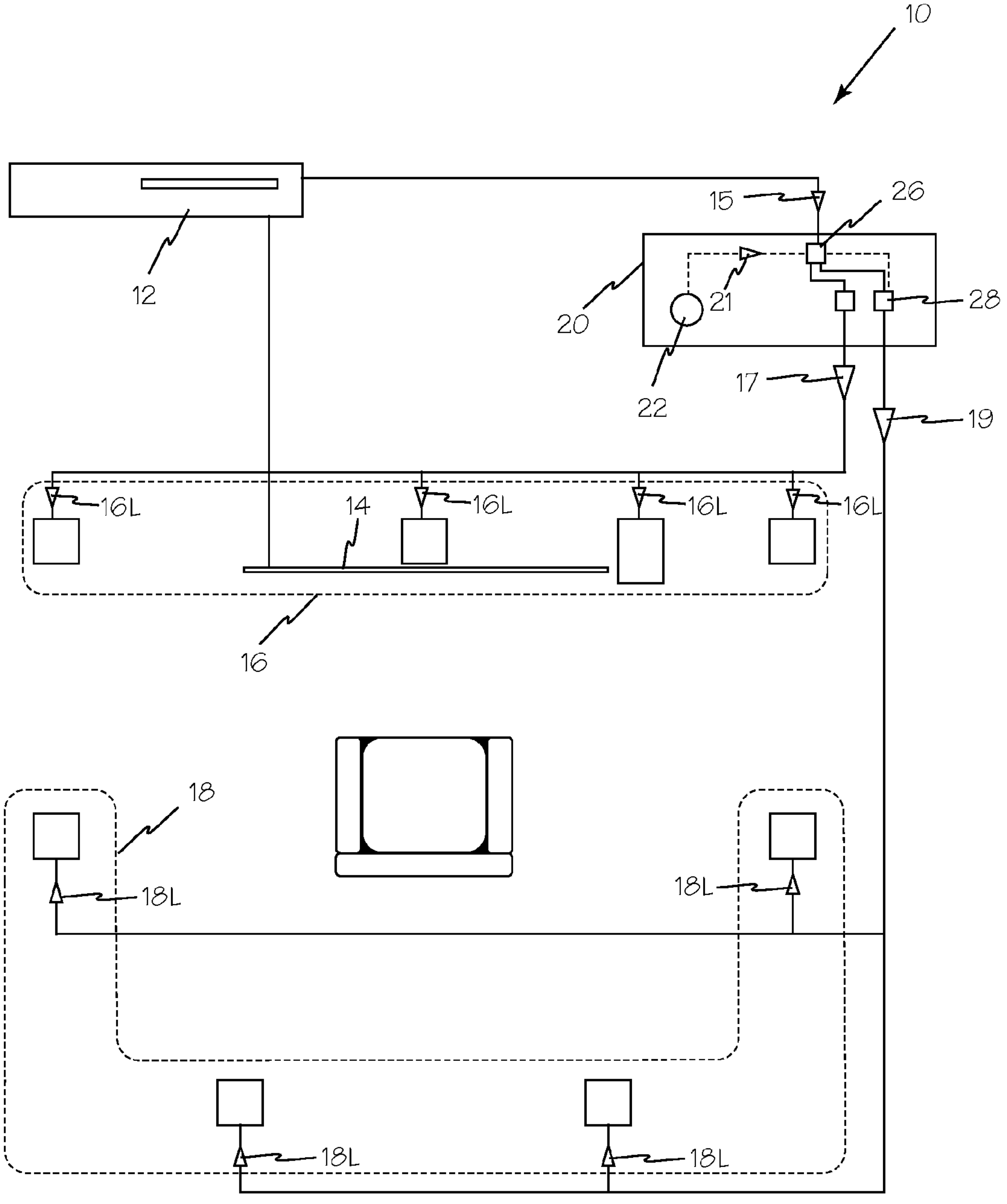
10
12
15
26
20
21
28
22
17
19
16L
16L
16L
16L
14
16
18
18L
18L
18L
18L

DYNAMIC SURROUND CHANNEL VOLUME CONTROL

RELATED APPLICATIONS

This application claims priority from copending U.S. provisional patent application No. 60/874,686 filed Dec. 12, 2006.

FIELD OF THE INVENTIONS

The inventions described below relate to the field of sound presentation and control and more specifically to multi-channel surround sound volume control.

BACKGROUND OF THE INVENTIONS

"I can't hear my surround speakers" is a very common consumer complaint.

As the volume level of a multi-channel audio system is varied from the presentation sound level at which the program material was mixed in a calibrated mixing studio, the listener is no longer presented with the same surround experience as at the presentation sound level. Except for occasional special effect sounds, the ambient material in the surround channels is recorded at a very low level relative to the front channels, so as system volume is reduced the ambient surround content is masked by environment noise or falls below the threshold of hearing. The problem is compounded when the system has no way of matching the studio performance sound level.

To allow a more acceptable low level listening experience a variety of manufactures offer a "late night listening" feature which upon user activation applies various types of level adjustments to a sound system. The changes applied by these systems are not based on the actual recorded levels or the particular playback conditions in the home rather they are arbitrary and subjective. Without knowing the performance sound levels from the studio or the sound level of the home they cannot match the experience of the original material as it was recorded at the performance sound level in the studio.

SUMMARY

A dynamic surround channel volume control can offset the volume level and loudness compensation of the surround channels dynamically (as the user adjusts the volume control) in order to provide a surround experience at all levels that closely matches the original (performance sound level) surround experience. In its simplest form, a sound system employing this technique applies a variable gain control to the surround channels of a multi-channel system. Thus the volume levels of the surround channels are related to the main volume control of the system which in turn maintains some predictable relationship between the surround channels and the main or front channels. Peak levels of the surround channels are controlled through the use of compression, peak limiting, soft clipping or variable gain. Average levels of the surround channels (related to the ambient content of the channels) are controlled using expansion, or variable gain. Thus the sense of surround envelopment is retained but does not distract when a loud special effect sound is used.

An example of a simple implementation is the use of an exponential volume control for the surround channels which is referenced to the volume control of the main channels. The change in surround level from a main channel volume of N dB to N−1 dB can be expressed as 10^(−i/n)+(x−1) where i is the starting volume level (N), n is y/log10(2−x), x is the initial step size (in surround channel dB per main channel dB), and y is the linear cutoff (main channel volume reduction level at which the surround channels will be reduced at the same rate as the main channels).

An extension of the example to improve control of the surround channel's peak level could be implemented using a fast acting peak limiter. A fast acting peak limiter can be implemented as follows. The signal is compared on a sample by sample basis to a limit value L (which is dynamically controlled by the master volume control). If the signal exceeds L for a time greater than the attack time T1 then the limiter enters limiting mode. In limiting mode the limiter will attenuate the volume of the channel (prior to the signal entering the limiter) at a rate of N dB per sample. If the signal remains below L for a time greater than T2, the limiter leaves limiting mode. When out of limiting mode the limiter returns the channel gain to its original value at a rate of M dB per sample.

BRIEF DESCRIPTION OF THE DRAWINGS

FIG. 1 is a block diagram of a surround sound system incorporating dynamic surround channel volume control.

DETAILED DESCRIPTION OF THE INVENTIONS

Surround sound system 10 as shown in FIG. 1 includes media player 12, display 14, front speakers 16, surround speakers 18 and sound apparatus 20. Sound apparatus 20 may be any suitable sound processing apparatus such as a sound receiver. Volume control 22 is primary volume control for sound apparatus 20. Sound signal 15 is provided from media player 12. Sound signal 15 is processed in processor 26 according to primary volume setting 21 and any other suitable parameters. Processor 26 separates primary channel signals 17 from surround signals 19.

While the preferred embodiments of the devices and methods have been described in reference to the environment in which they were developed, they are merely illustrative of the principles of the inventions. Other embodiments and configurations may be devised without departing from the spirit of the inventions and the scope of the appended claims.

The volume levels of surround channels 18 are related to the main volume setting 21 which in turn maintains some predictable relationship between surround channel signals 18L and the main or front channel signals 16L. Peak levels of surround channel signals 18L are controlled with surround controller 28 through the use of compression, peak limiting, soft clipping or variable gain. Average levels of the surround channels (related to the ambient content of the channels) are controlled using expansion, or variable gain.

We claim:

1. A dynamic surround channel volume control for sound content recorded at a performance sound pressure level to present the sound content at lower than performance sound pressure level comprising:

- means for processing sound content to form two or more main channel signals and two or more surround signals with the surround signals related to the main channel signals in a predictable relationship to the performance sound pressure level, the processing means including a main volume control;
- means for applying a variable gain to the two or more surround signals as a function of the performance sound pressure level and the main volume control; and means for limiting peak levels of the two or more surround signals.

2. The dynamic surround channel volume control of claim 1 wherein the means for applying a variable gain to the two or more surround signals as a function of the performance sound pressure level and the main volume control comprises:

an exponential volume control in which the change in surround channel sound level from a main channel volume of N dB to N−1 dB is expressed as 10^(−i/n)+(x−1) where i is the starting volume level (N), n is y/log10(2−x), x is the initial step size in surround channel dB per main channel dB, and y is the linear cutoff at which the surround channel volume will be reduced at the same rate as the main channels.

3. The dynamic surround channel volume control of claim 1 wherein the means for limiting peak levels comprises:

A fast acting peak limiter in which the surround channel signals are compared on a sample by sample basis to a limit value L which is dynamically controlled by the main volume control, and if a surround signal exceeds L for a time greater than attack time T1 then the peak limiter enters a limiting mode to attenuate the volume of the surround channel prior to the surround channel signal entering the limiter at a rate of N dB per sample, and when the surround signal remains below L for a time greater than T2, the limiter leaves limiting mode and returns the surround channel gain to its original value at a rate of M dB per sample.

* * * * *